US009460964B2

United States Patent
Kim

(10) Patent No.: US 9,460,964 B2
(45) Date of Patent: Oct. 4, 2016

(54) METHOD FOR FORMING VOID-FREE POLYSILICON AND METHOD FOR FABRICATING SEMICONDUCTOR DEVICE USING THE SAME

(71) Applicant: SK hynix Inc., Gyeonggi-do (KR)

(72) Inventor: Hyung-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/013,389

(22) Filed: Feb. 2, 2016

(65) Prior Publication Data

US 2016/0163594 A1 Jun. 9, 2016

Related U.S. Application Data

(62) Division of application No. 13/845,414, filed on Mar. 18, 2013, now Pat. No. 9,287,163.

(30) Foreign Application Priority Data

Dec. 26, 2012 (KR) ........................ 10-2012-0153822

(51) Int. Cl.
*H01L 21/32* (2006.01)
*H01L 21/47* (2006.01)
*H01L 21/768* (2006.01)
*H01L 27/108* (2006.01)
*H01L 21/28* (2006.01)
(Continued)

(52) U.S. Cl.
CPC ... *H01L 21/76897* (2013.01); *H01L 21/28079* (2013.01); *H01L 21/28088* (2013.01); *H01L 21/31111* (2013.01); *H01L 21/31116* (2013.01); *H01L 21/31144* (2013.01); *H01L 21/324* (2013.01); *H01L 21/7682* (2013.01); *H01L 21/76802* (2013.01); *H01L 21/76831* (2013.01); *H01L 21/76847* (2013.01); *H01L 21/76883* (2013.01); *H01L 27/1085* (2013.01); *H01L 27/10876* (2013.01); *H01L 27/10885* (2013.01); *H01L 27/10888* (2013.01); *H01L 27/228* (2013.01); *H01L 27/2436* (2013.01)

(58) Field of Classification Search
CPC .......... H01L 21/7688; H01L 21/8242; H01L 21/7682; H01L 21/76834; H01L 23/5222; H01L 21/768; H01L 21/00
USPC .............. 438/586, 675, 253, 243, 386, 597, 438/622–624, 631–637; 257/306, 522, 734, 257/751, E23.155, E27.097, E21.649
See application file for complete search history.

(56) References Cited

U.S. PATENT DOCUMENTS

| | | | |
|---|---|---|---|
| 6,903,001 B2 * | 6/2005 | Bhattacharyya .. | H01L 21/02337 257/E21.273 |
| 7,985,654 B2 * | 7/2011 | Breitwisch ............ | H01L 45/06 257/522 |
| 8,933,430 B1 * | 1/2015 | Jung .................. | H01L 45/1683 257/295 |

(Continued)

*Primary Examiner* — Yuanda Zhang
*Assistant Examiner* — Sheikh Maruf
(74) *Attorney, Agent, or Firm* — IP & T Group LLP

(57) ABSTRACT

A method for fabricating a semiconductor device includes forming a buried gate electrode in a semiconductor substrate. An insulating layer is formed over the buried gate electrode and is etched to form a contact hole exposing the semiconductor substrate. A sacrificial spacer is formed on sidewalls of the insulating layer defining the contact hole. A polysilicon layer pattern is formed in the contact hole. The sacrificial spacer is removed to form an air gap around the polysilicon layer pattern. A thermal process is performed to remove a seam existing in the polysilicon layer pattern.

13 Claims, 19 Drawing Sheets

(51) Int. Cl.
*H01L 21/311* (2006.01)
*H01L 21/324* (2006.01)
*H01L 27/22* (2006.01)
*H01L 27/24* (2006.01)

(56) References Cited

U.S. PATENT DOCUMENTS

| | | | | |
|---|---|---|---|---|
| 2002/0182872 A1* | 12/2002 | Wu | ............... | H01L 21/2815 438/705 |
| 2003/0054630 A1* | 3/2003 | Kirchhoff | ......... | H01L 21/76224 438/624 |
| 2005/0230834 A1* | 10/2005 | Schmitt | ............... | C23C 16/401 257/758 |
| 2006/0214305 A1* | 9/2006 | Sakata | ............... | C23C 16/045 257/774 |
| 2008/0050886 A1* | 2/2008 | Hirota | ............... | H01L 21/76224 438/424 |
| 2009/0267176 A1* | 10/2009 | Yang | ............... | H01L 21/76224 257/506 |
| 2010/0314258 A1* | 12/2010 | Cohen | ............... | B81C 99/0095 205/188 |
| 2011/0217838 A1* | 9/2011 | Hsieh | ............... | H01L 21/768 438/618 |
| 2012/0225504 A1* | 9/2012 | Hong | ............... | H01L 22/14 438/17 |

\* cited by examiner

METHOD FOR FORMING VOID-FREE POLYSILICON AND METHOD FOR FABRICATING SEMICONDUCTOR DEVICE USING THE SAME

CROSS-REFERENCE TO RELATED APPLICATIONS

This application is a division of U.S. patent application Ser. No. 13/845,414 filed on Mar. 18, 2013, which claims priority of Korean Patent Application No. 10-2012-0153822, filed on Dec. 26, 2012. The disclosure of each of the foregoing applications is incorporated herein by reference in its entirety.

BACKGROUND

1. Field

Exemplary embodiments of the present invention relate to a method for fabricating a semiconductor device and more particularly, to a method for forming void-free polysilicon and a method for fabricating a semiconductor device using the same.

2. Description of the Related Art

When a contact plug, such as a bit line contact plug or storage node contact plug, is formed, polysilicon may be used.

However, when a contact hole having a high aspect ratio is gap-filled with polysilicon, slits occur in the polysilicon. The slits occur when the surfaces of polysilicon which is grown while depositing from the bottom surface of the contact hole meet each other. The slits are hold together in a direction to minimize the surface areas of the slits and then develop into a void during a subsequent thermal process. Therefore, as a semiconductor device is highly integrated, the size of a void existing in a contact plug increases.

Such a void randomly exists inside the contact plug. However, as a subsequent heat process is performed, the void may be moved to a top or bottom interface or a side interface, thereby increasing interface resistance of the contact plug. Furthermore, when a void exists in polysilicon, the void may increase bulk resistance, thereby causing a resistive fail.

SUMMARY

Various embodiments are directed to a method for forming void-free polysilicon and a method for fabricating a semiconductor device using the same.

A method for fabricating a semiconductor device includes: forming a second layer over a first layer; forming an open portion by etching the second layer; forming a sacrificial layer on sidewalls of the second layer defining the open portion; forming a polysilicon layer pattern in the open portion; forming an air gap by removing the sacrificial layer; and performing a thermal process to remove a seam in the polysilicon layer pattern.

A method for fabricating a semiconductor device includes forming a buried gate electrode in a semiconductor substrate; forming an insulating layer over the buried gate electrode; etching the insulating layer to form a contact hole exposing the semiconductor substrate; forming a sacrificial layer on sidewalls of the insulating layer defining the contact hole; forming a polysilicon layer pattern in the contact hole; forming an air gap by removing the sacrificial spacer; and performing a thermal process to remove a seam in the polysilicon layer pattern.

A method for fabricating a semiconductor device, includes forming a plurality of bit line structures over a semiconductor substrate; forming a storage node contact hole between the plurality of bit line structures; forming a sacrificial spacer on sidewalls of the bit line structures defining the storage node contact hole; forming a first contact plug in the storage node contact hole; forming an air gap by removing the sacrificial spacer; performing a thermal process to remove a seam in the first contact plug; forming a capping spacer to cap the air gap; and forming a second contact plug over the first contact plug.

A semiconductor device includes a first insulating layer formed on a substrate, the first insulating layer having a contact hole to expose a surface of the substrate; a contact plug formed in the contact hole; an air gap formed between the contact plug and sidewalls of the first insulating layer defining the contact hole, the air gap providing a passage by which a seam in the contact plug may be removed during a heat treatment; and a second insulating layer to fill the air gap after the heat treatment.

DETAILED DESCRIPTION

Figure 1A:
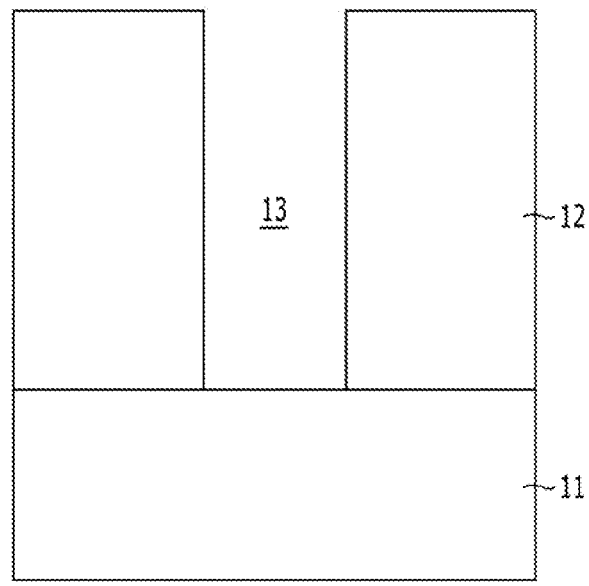
FIGS. 1A to 1G are diagrams illustrating an exemplary method for forming void-free polysilicon.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1G are diagrams illustrating an exemplary method for forming void-free polysilicon in accordance.

Referring to FIG. 1A, a second layer 12 is formed over a first layer 11. The first layer 11 may include a semiconductor substrate. The first layer 11 may include a conductive material or insulating material. The first layer 11 may include silicon. The first layer 11 may include a silicon substrate and a silicon germanium substrate. Furthermore, the first layer 11 may include a silicon-on-insulator (SOI) substrate. The second layer 12 may include a conductive material or insulating material. The first layer 11 and the second layer 12 may include different insulating materials having an etch selectivity. The second layer 12 may include silicon oxide or silicon nitride.

The second layer 12 is etched to form an open portion 13. The open portion 13 may be a contact hole, such as a bit line contact hole or storage node contact hole. Furthermore, the open portion 23 bea line-type contact hole. Alternatively, the open portion 13 may be formed by etching the semiconductor substrate 11. A contact plug, a buried gate electrode, or an electrode of a buried capacitor may be formed in the open portion 13.

Figure 1B:
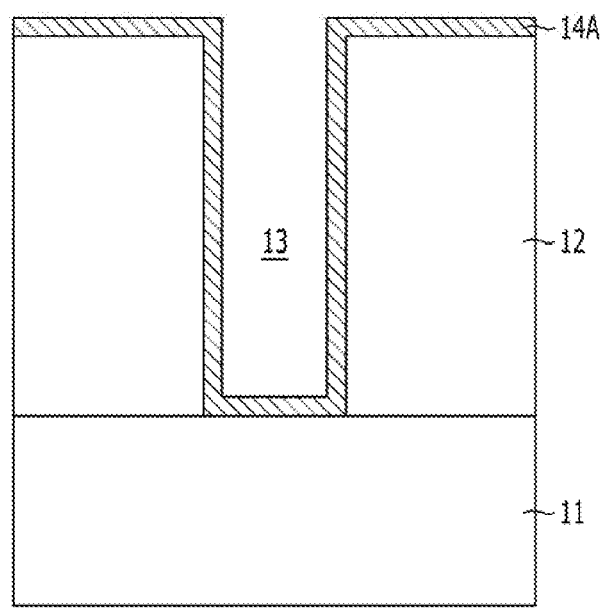

Referring to FIG. 1B, a sacrificial layer 14A is formed over the second layer 12 including the open portion 13. The sacrificial layer 14A may include a material having an etch selectivity that is greater than an etch selectivity of the second layer 12. If the second layer 12 includes silicon oxide, then the sacrificial layer 14A may include a material having an etch selectivity that is greater than an etch selectivity of silicon oxide. For example, the sacrificial layer 14A may include silicon nitride, boron nitride, or titanium nitride. If the second layer 12 includes silicon nitride or boron nitride, the sacrificial layer 14 may include silicon oxide or titanium nitride.

Figure 1C:
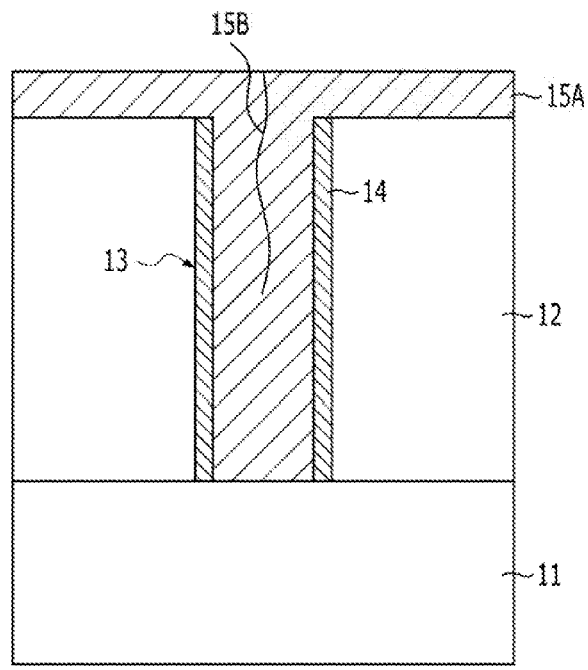

Referring to FIG. 1C, a sacrificial spacer 14 may be formed by etching the sacrificial layer 14A. The sacrificial layer 14A may be etched through an etch-back process. The sacrificial spacer 14 may be formed on sidewalls of the second layer 12 that define the open portion 13.

Then, a polysilicon layer 15A is formed on the entire surface of the resultant structure to fill the open portion 13. Before the polysilicon layer 15A is formed, a pre-cleaning process may be performed. When the polysilicon layer 15A is formed, a seam 15B may occur.

Figure 1D:
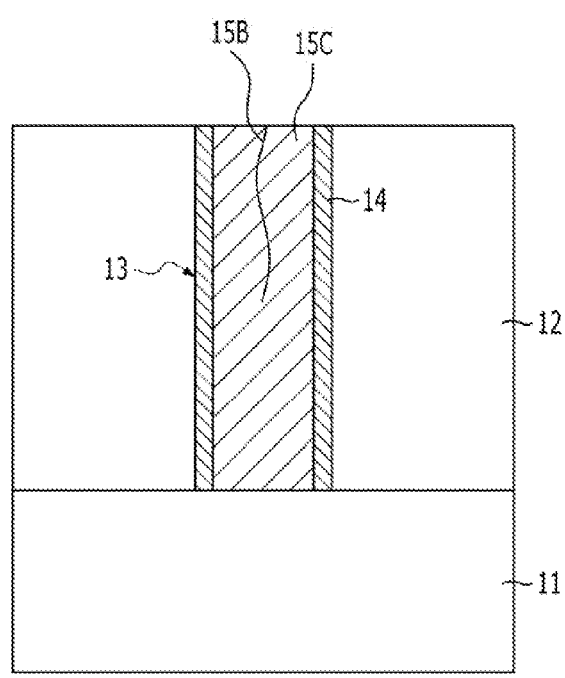

Referring to FIG. 1D, a polysilicon layer pattern 15C is formed. In order to form the polysilicon layer pattern 15C, the polysilicon layer 15A may be selectively removed from the surface of the second layer 12. Although the polysilicon layer pattern 15C is formed, the seam 15B may still exist in the polysilicon layer pattern 15C.

Figure 1E:
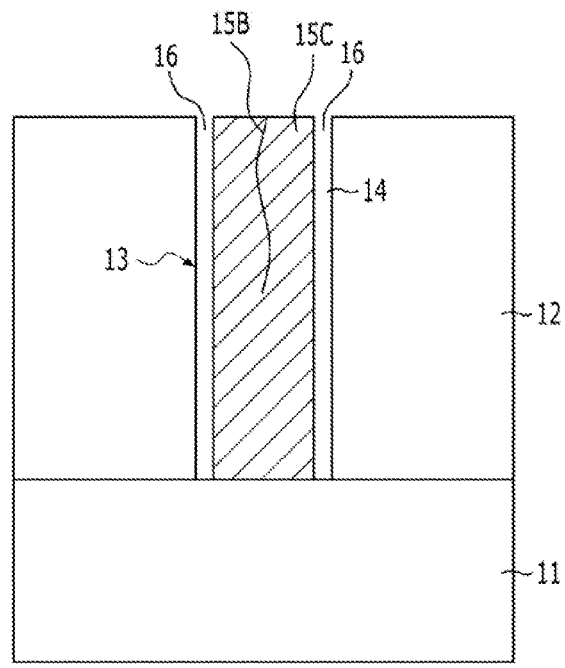

Referring to FIG. 1E, the sacrificial spacer 14 is selectively removed to form an air gap 16. The sacrificial spacer 14 may be removed by wet etching. The air gap 16 may be formed between the second layer 12 and the sidewalls of the polysilicon layer pattern 15C. If the sacrificial spacer 14 includes silicon nitride, then a phosphoric acid-based chemical may be used to remove the sacrificial spacer 14. If the sacrificial spacer 14 includes silicon oxide, a hydrofluoric acid-based chemical may be used to remove the sacrificial spacer 14. If the sacrificial spacer 14 includes titanium nitride or boron nitride a sulphuric acid-based chemical may be used to remove the sacrificial spacer 14.

Figure 1F:
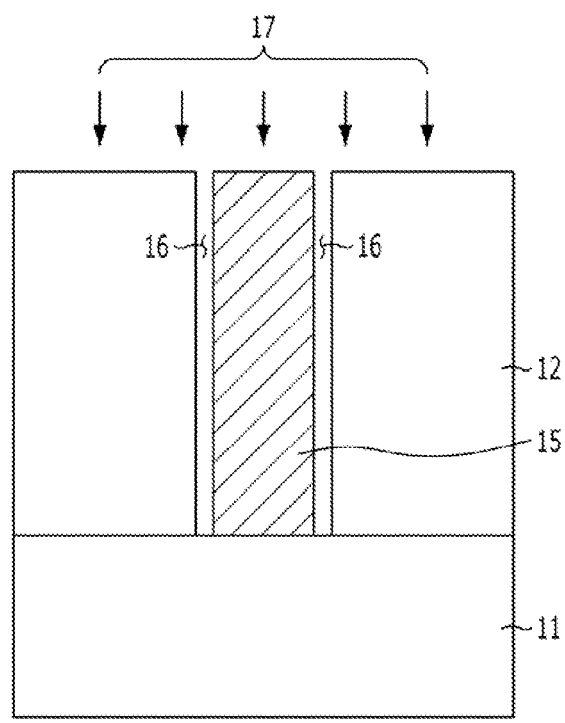

Referring to FIG. 1F, a thermal process 17 is performed and the seam 15B existing in the polysilicon layer pattern 15C is removed. More specifically, as the seam 15B escapes toward the air gap 16, the seam 15B is removed. The thermal process 17 may be performed at a temperature of at least 500° C. or more. The thermal process 17 may include a heat treatment using a furnace.

As described above, since the thermal process 17 is performed after the air gap 16 is formed, the seam 15B is removed. Since the air gap 16 is formed on the polysilicon layer pattern 15C and the top surface of the polysilicon layer pattern 15C is exposed to the air, the removal effect of the seam 15B increases. That is, as the seam 15B is diffused toward the air gap 16 and simultaneously diffused to the outside of the top surface of the polysilicon layer pattern 15C, the seam 15B is removed.

In an exemplary embodiment, since the outer surface of the polysilicon layer pattern 15C contacts the surrounding air gap 16, the seam 15B existing in the polysilicon layer pattern 15C does not develop into a void, but is removed. The reason why the seam 15B is removed is that a surface tension between the air gap 16 and the polysilicon layer pattern 15C is different from a surface tension between the second layer 12 and the polysilicon layer pattern 15C.

Therefore, in accordance with an exemplary embodiment of, it is possible to form a void-free polysilicon layer pattern 15.

Figure 1G:
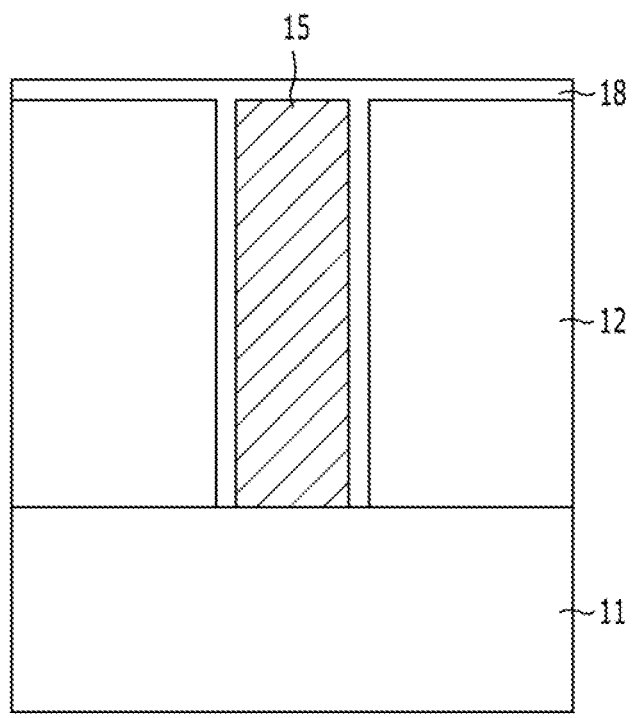

Referring to FIG. 1G, after the thermal process 17 is performed, the air gap 16 may be filled with a third layer 18. The third layer 18 may include an insulating material. The third layer 18 may include silicon oxide or silicon nitride.

Figure 2A:
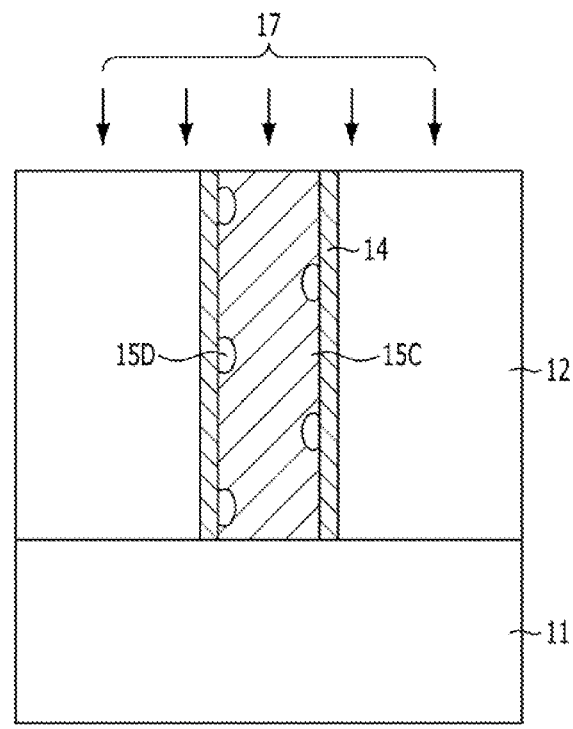
FIGS. 2A and 2B are diagrams illustrating comparative examples related to an exemplary embodiment.
Figure 2B:
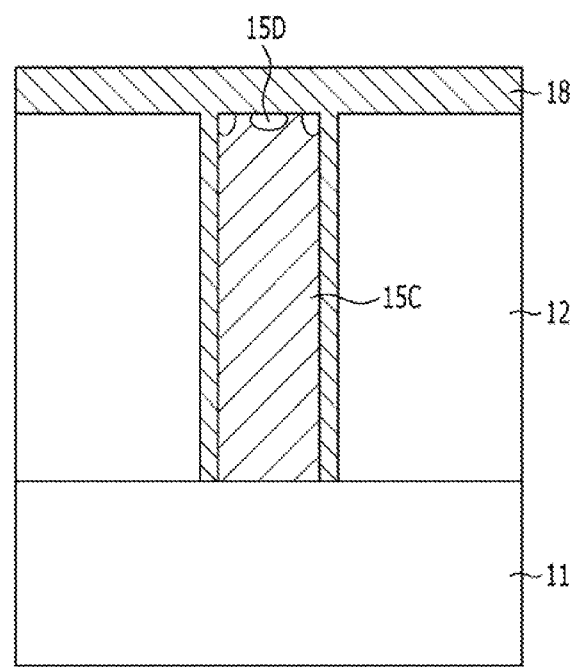

FIGS. 2A and 2B are diagrams for explaining comparative examples related to an exemplary embodiment.

Referring to FIG. 2A, if the sacrificial spacer 14 remains on the sidewalls of the polysilicon layer pattern 15C and the thermal process 17 is performed, then grain growth may occur through the motion of silicon atoms, and the silicon atoms are moved in a direction to minimize the surface area of the seam 15B. Accordingly, voids 15D occur. Therefore, the voids 15D are formed at the interface between the sacrificial spacer 14 and the polysilicon layer pattern 15C. Furthermore, referring to FIG. 2B, if a thermal process for forming the third layer 18 over the polysilicon layer pattern 15C is performed after the air gap 16 is formed, voids 15D are formed at the interface between the polysilicon layer pattern 15C and the third layer 18.

As shown by the comparative examples, it is difficult to form a void-free polysilicon layer pattern.

FIGS. 3A to 3H are diagrams illustrating an exemplary method of fabricating a semiconductor device.

Figure 3A:
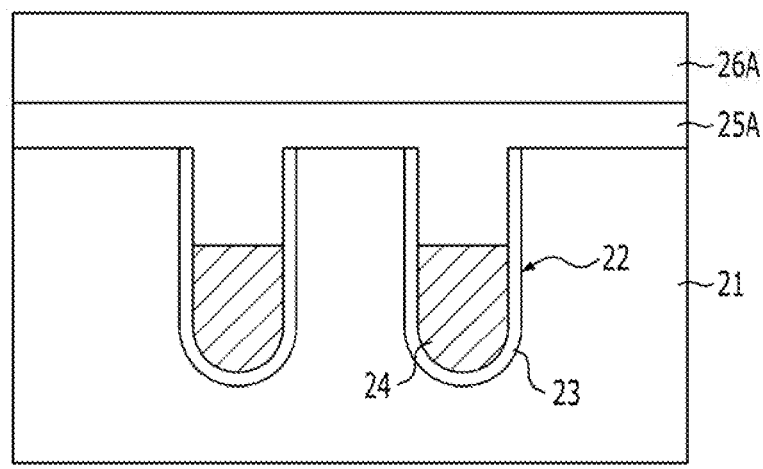
FIGS. 3A to 3H are diagrams illustrating an exemplary method of fabricating a semiconductor device.

Referring to FIG. 3A, a semiconductor substrate 21 is etched to form a trench 22. A gate dielectric layer 23 is formed on the surface of the trench 22. The semiconductor substrate 21 may include a semiconductor material. The semiconductor substrate 21 may include a silicon substrate. For example, the semiconductor substrate 21 may include a single crystal silicon substrate. Although not illustrated, an isolation region may be formed in the semiconductor substrate 21. The isolation region may be formed by a shat trench isolation (STI) process.

A buried gate electrode 24 is formed over the gate dielectric layer 23 in the trench 22. The buried gate electrode 24 may be formed by forming a metal containing layer to gap-fill the trench 22 and then etching back the metal containing layer. The metal containing layer may include a material with a metal base such as titanium, tantalum, or tungsten. The metal containing layer may include, for example, tantalum nitride (TaN), titanium nitride (TiN), tungsten nitride (WN), or tungsten (W). For example, the buried gate electrode 24 may have a single layer structure of TiN, TaN, or W, or a two-layer structure of TiN/W or TaN/W, in which W is stacked over TiN or TaN. Furthermore, the buried gate electrode 24 may have a two-layer structure of WN/W, in which W is stacked over WN. In addition, the buried gate electrode 24 may include a metallic material having low resistance.

A sealing layer 25A is formed over the buried gate electrode 24. The sealing layer 25A is formed over the buried gate electrode 24 to fill the trench 22. The sealing layer 25A may serve to protect the buried gate electrode 24 during a subsequent process. The sealing layer 25A may include an insulating material. The sealing layer 25A may include silicon nitride.

An insulating layer 26A is formed over the sealing layer 25A. The insulating layer 26A may include silicon oxide.

Figure 3B:
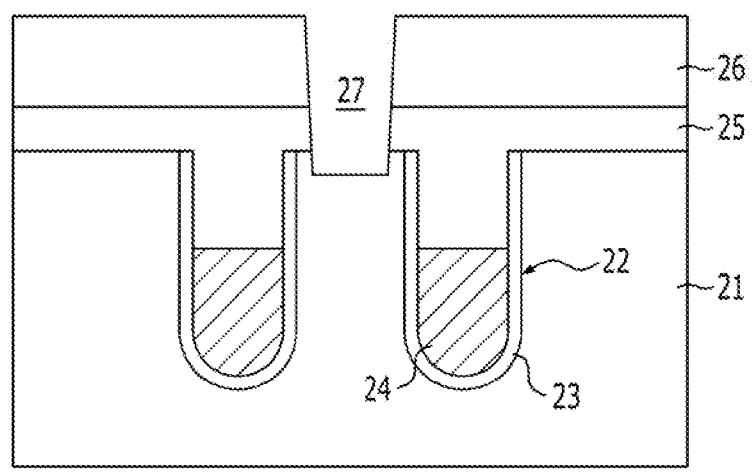

Referring to FIG. 3B, the insulating layer 26A and the sealing layer 25A are etched to form a contact hole 27. When the contact hole 27 is formed, the surface of the semiconductor substrate 21 may be recessed to a predetermined depth. Accordingly the contact area of a subsequent contact plug may be increased. As the contact hole 27 is formed, the sealing layer and the insulating layer are represented by 25 and 26, respectively.

Figure 3C:
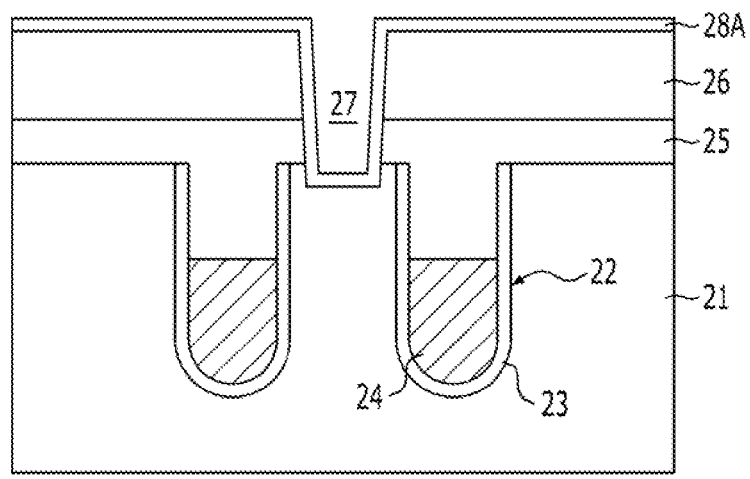

Referring to FIG. 3C, a sacrificial layer 28A is formed on the entire surface of the resultant structure including the contact hole 27. The sacrificial layer 28A may include silicon oxide, silicon nitride, boron nitride, or titanium nitride.

Figure 3D:
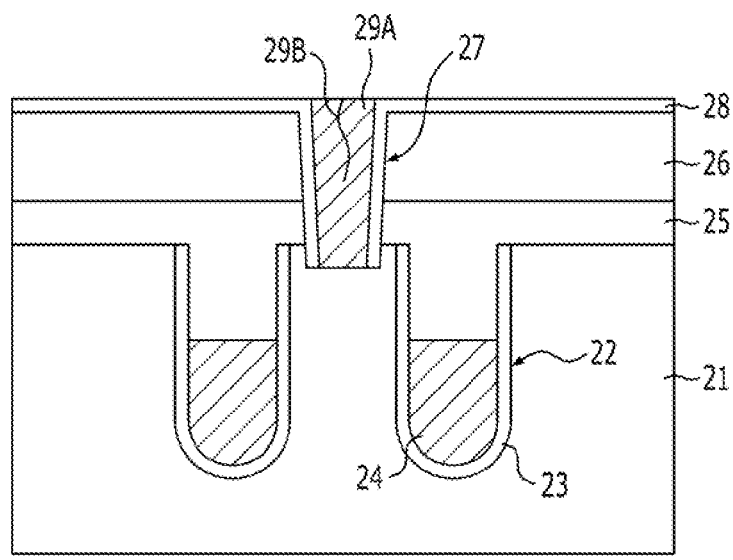

Referring to FIG. 3D, the sacrificial layer may be etched until the bottom surface of the contact hole 27 is exposed. Accordingly, a sacrificial spacer 28 is formed.

Then a contact plug 29A is formed to fill the contact hole 27. In order to form the contact plug 29A, polysilicon may be formed on the entire surface of the resultant structure to fill the contact hole 27, and then may be selectively removed from the surface of the insulating layer 26. Before the polysilicon is formed, pre-cleaning may be performed. When the polysilicon is formed, a seam 29B may occur. Although the contact plug 29A is formed, the seam 29B may still exist in the contact plug 29A. The contact plug 29A may include a bit line contact plug.

Figure 3E:
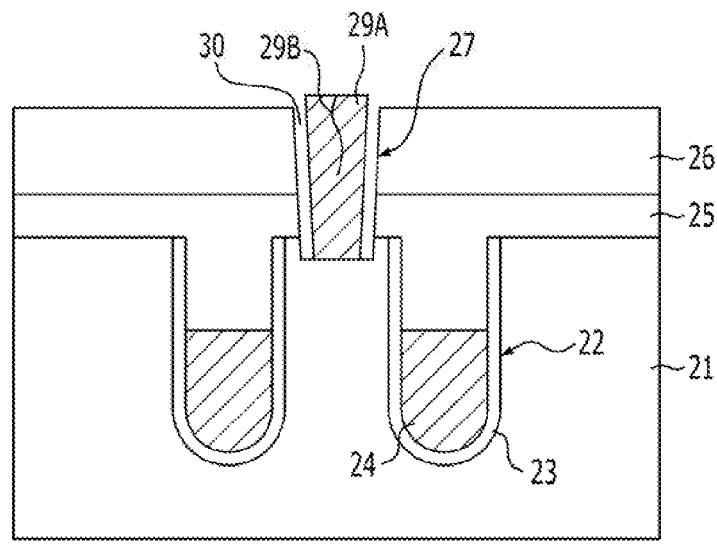

Referring to FIG. 3E, the sacrificial spacer 28 is selectively removed. Accordingly, an air gap 30 may be formed. The air gap 30 may be formed between the sidewall of the contact plug 29A and the sidewall of the contact hole 27. The sacrificial spacer 28 may be removed by wet etching. If the sacrificial spacer 28 includes silicon nitride, then a phosphoric acid-based chemical may be used to remove the sacrificial spacer 28. If the sacrificial spacer 28 includes silicon oxide, then a hydrofluoric acid-based chemical may be used to remove the sacrificial spacer 28. If the sacrificial spacer 28 includes titanium nitride or boron nitride, then a sulphuric acid-based chemical may be used to remove the sacrificial spacer 28.

Figure 3F:
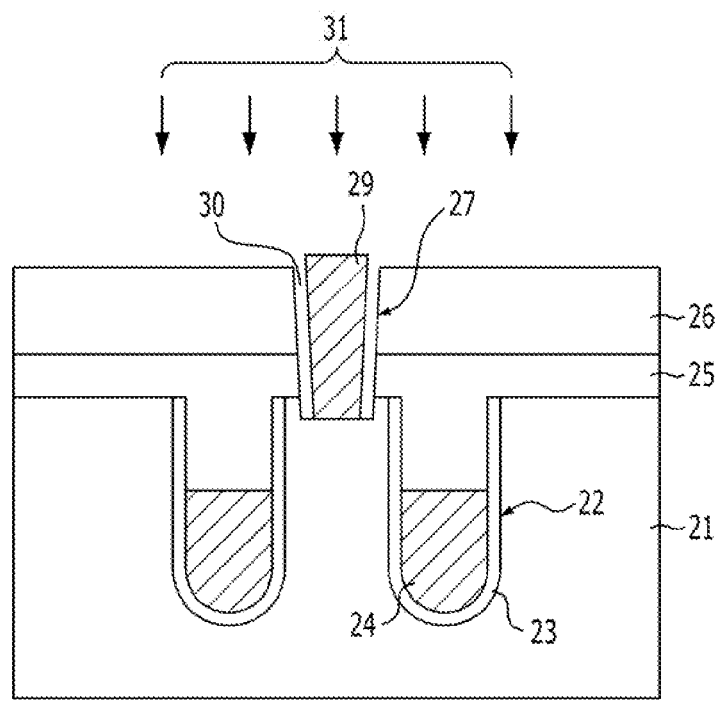

Referring to FIG. 3F, a thermal process 31 is performed. Accordingly, the seam 29B existing in the contact plug 29A is removed. More specifically, the seam 29B escapes toward the air gap 30 and is then removed. The thermal process 31 may be performed at a temperature of at least 500° C. or more. The thermal process 31 may include a heat treatment using a furnace.

Since the air gap 30 is formed at the sidewalls of the contact plug 29A, and since the top surface of the contact plug 29A is exposed to the air, the removal effect of the seam 29B increases. That is, as the seam 29B is diffused toward the air gap 30 and simultaneously diffused to the outside of the top surface of the contact plug 29A, the seam 28B is removed.

In an exemplary embodiment, since the outer surface of the contact plug 29A is contacted with the surrounding air gap 30 and the air, the seam 29B existing in the contact plug 29A does not develop into a void, but is removed. The reason why the seam 29B is removed is that a surface tension between the air gap 30 and the contact plug 29A is different from a surface tension between the contact plug 29A and the insulating layer 26 or the sealing layer 25. Thus, it is possible to form a void-free contact plug 29.

Figure 3G:
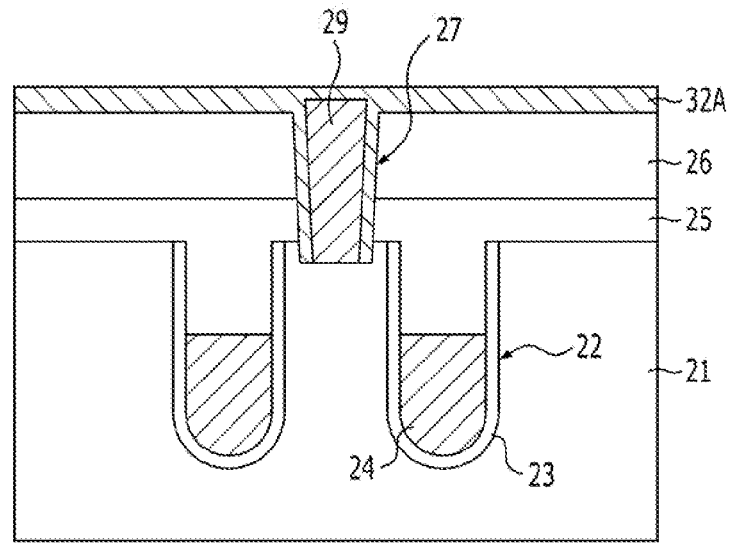

Referring to FIG. 3G, a capping layer 32A is used to fill the air gap 30. The capping layer 32A may include an insulating material. The capping layer 32A may include silicon oxide or silicon nitride.

Figure 3H:
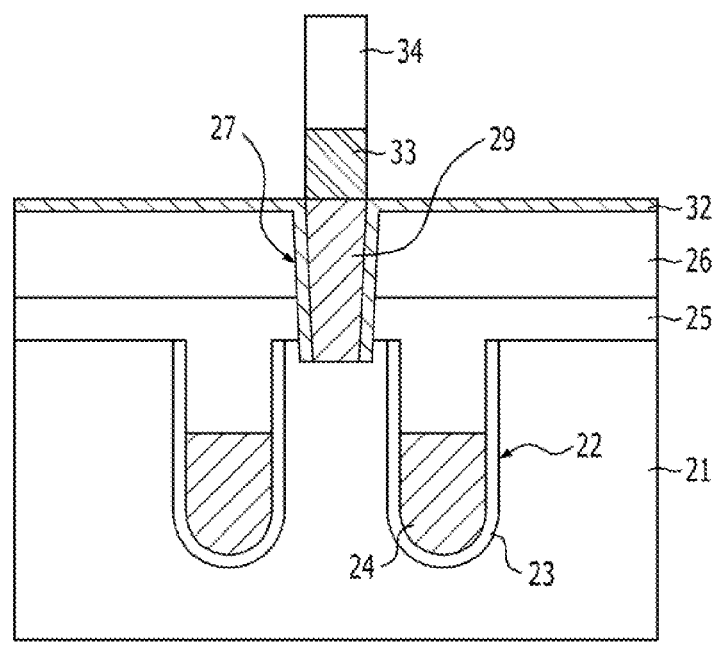

Referring to FIG. 3H, the capping layer 32A is selectively etched to expose the surface of the contact plug 29. Accordingly, a capping layer pattern 32 is formed.

A bit line structure, including a bit line 33 and a bit line hard mask layer 34, is formed over the contact plug 29. The bit line 33 may include a tungsten layer, or may include a barrier layer of Ti/TiN and a tungsten layer over the barrier layer. The bit line hard mask layer 34 may include silicon nitride.

FIGS. 4A to 4K are diagrams illustrating an exemplary method of fabricating a semiconductor device.

Figure 4A:
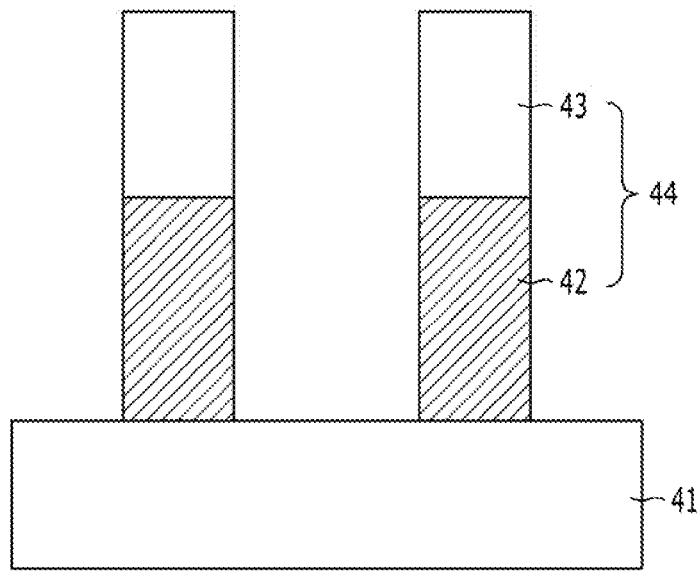
FIGS. 4A to 4K are diagrams illustrating an exemplary method of fabricating a semiconductor device.

Referring to FIG. 4A, a plurality of bit line structures 44 are formed over a substrate 41. The substrate 41 may include silicon. The substrate 41 may include a silicon substrate and a silicon germanium substrate. Furthermore, the substrate 41 may include an SOI substrate.

The bit line structures 44 may be arranged at even intervals from each other in a line shape. In order to form the bit line structures 44, a hard mask pattern 43 is formed over a first conductive layer. Using the hard mask pattern 43 as an etch mask, the first conductive layer is etched to form a bit line 42. Accordingly, the bit line structure 44, in which the bit line 42 and the hard mask pattern 43 are stacked, is formed. The bit line 42 may include a silicon containing layer or a metal containing layer. For example, the bit line 42 may include polysilicon or tungsten. Furthermore, the bit line 42 may be formed by stacking a barrier layer and a metal layer. The bit line 42 may include a stacked structure of a titanium containing layer and a tungsten layer. The titanium containing layer is a barrier layer, and may be formed by stacking titanium and titanium nitride.

Figure 4B:
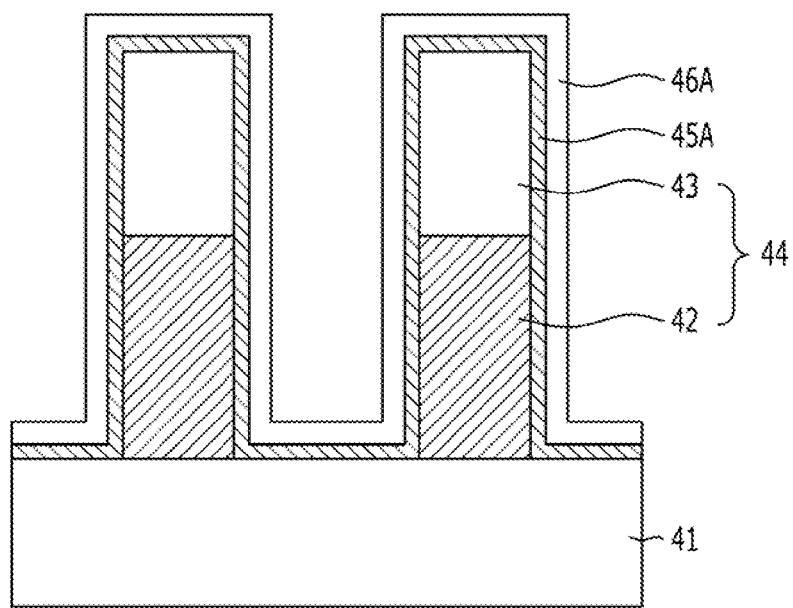

Referring to FIG. 4B, an insulating layer 45A is formed on the entire surface of the resultant structure including the bit line structure 44. The insulating layer 45A may include nitride or oxide. The insulating layer 45A may include silicon nitride or silicon oxide. The insulating layer 45A is a material for forming a spacer.

A sacrificial layer 46A is formed over the insulating layer 45A. The sacrificial layer 46A is removed to form an air gap during a subsequent process. The sacrificial layer 46A may include a material having an etch selectivity that is higher than an etch selectivity of the insulating layer 45A. The sacrificial layer 46A may include silicon oxide, silicon nitride, or metal nitride. If the insulating layer 35A includes silicon oxide, then the sacrificial layer 46A may include metal nitride or silicon nitride. If the insulating layer 45A includes silicon nitride, then the sacrificial layer 46A may include silicon oxide or metal nitride. The sacrificial layer 46A may include silicon oxide, silicon nitride, or titanium nitride (TiN). Furthermore, the sacrificial layer 46A may include boron nitride.

Figure 4C:
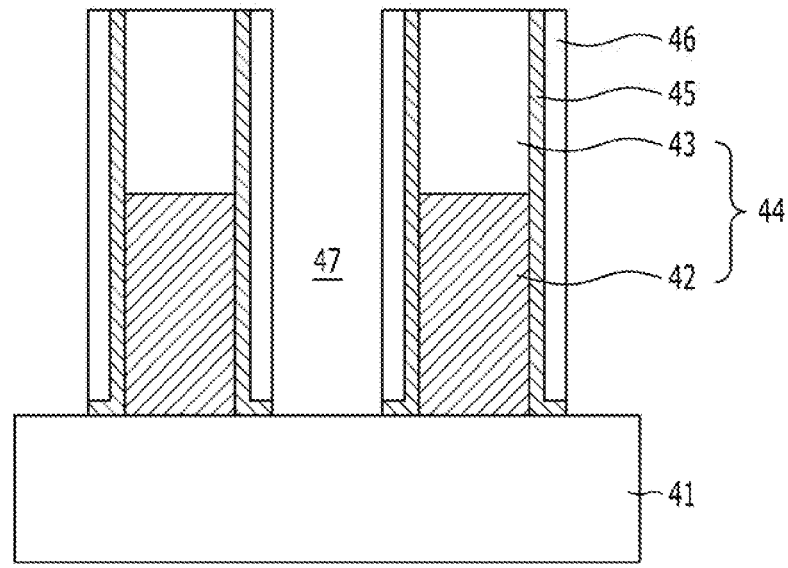

Referring to FIG. 4C, a double spacer is formed on both sidewalls of the bit line structure 44. The double spacer may include a spacer 45 and a sacrificial spacer 46. The spacer 45 may be formed by etching the insulating layer 45A. The sacrificial spacer 46 may be formed on the sidewalls of the spacer 45. The sacrificial spacer 46 may be formed by etching the sacrificial layer 46A. In order to form the spacer 45 and the sacrificial spacer 46, an etch-back process may be applied.

As the spacer 45 and the sacrificial spacer 46 are formed, a storage node contact hole 47 may be formed between the bit line structures 44, so as to expose the substrate 41. Alternatively, after the spacer 45 is formed, an interlayer dielectric layer (not illustrated) may be formed. Then, the interlayer dielectric layer is etched to form the storage node contact hole 47, a sacrificial layer is deposited, and an etch-back process is performed to form the sacrificial spacer 46 on the sidewalls of the storage node contact hole 47. The storage node contact hole 47 may be formed to expose the sidewalls of the sacrificial spacer 46. The storage node contact hole 47 may have a line shape or contact hole shape.

Figure 4D:
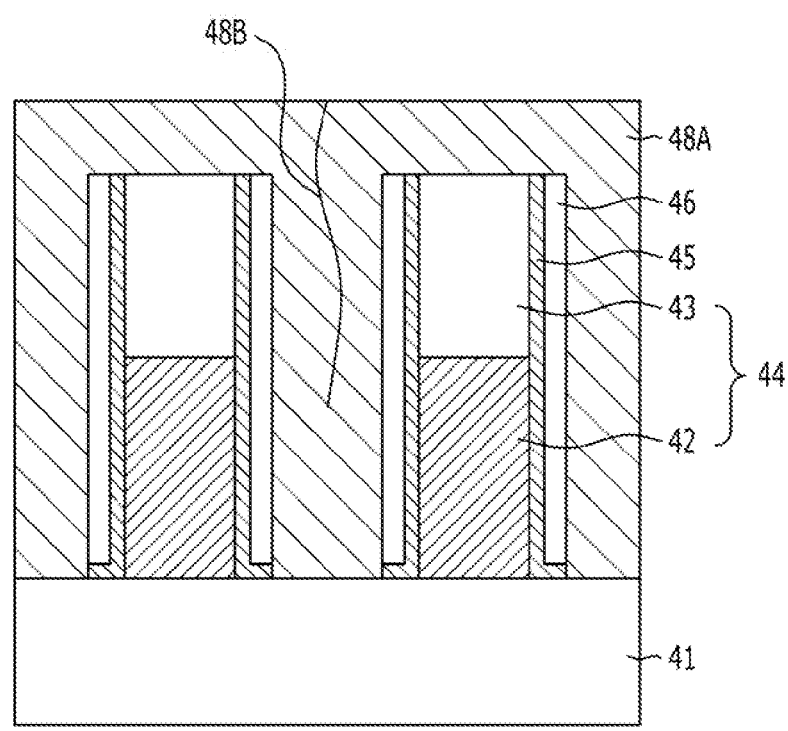

Referring to FIG. 4D, a second conductive layer 48A is formed to fill the storage node contact hole 47. The second conductive layer 48A may include a silicon containing layer. The second conductive layer 48A may include polysilicon. The polysilicon may be formed by a chemical vapor deposition (CVD) method. When the polysilicon silicon is formed, a seam 48B may occur.

Figure 4E:
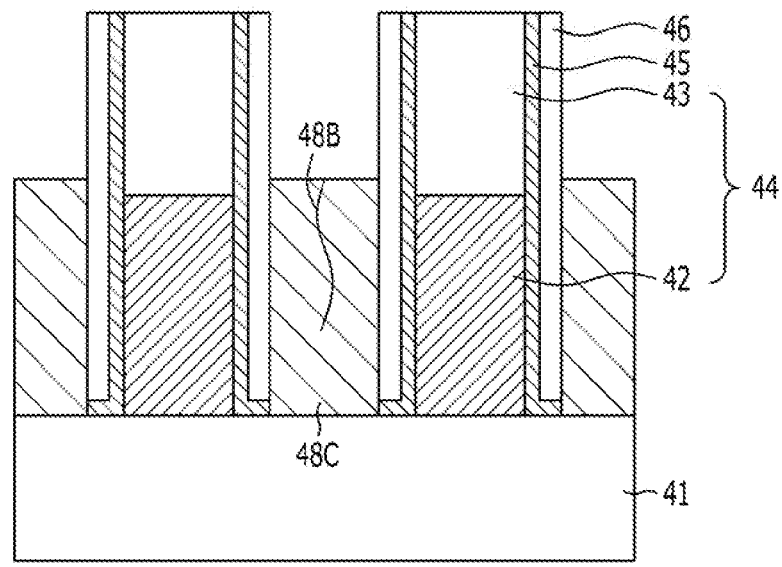

Referring to FIG. 4E, the second conductive layer 48A is selectively removed. Accordingly, a first contact plug 48C is formed between the bit line structures 44. In order to form the first contact plug 48C, an etch-back process may be applied. The surface of the first contact plug 48C has a lower level than the surface of the bit line structure 44. The surface of the first contact plug 48C may be controlled to a higher level than at least the top surface of the bit line 42. The first contact plug 48 may have a height to minimize a facing area with respect to the bit line 42. Accordingly, parasitic capacitance between the bit line 42 and the first contact plug 48C may be reduced. The first contact plug 48C becomes a part of a storage node contact plug.

Figure 4F:
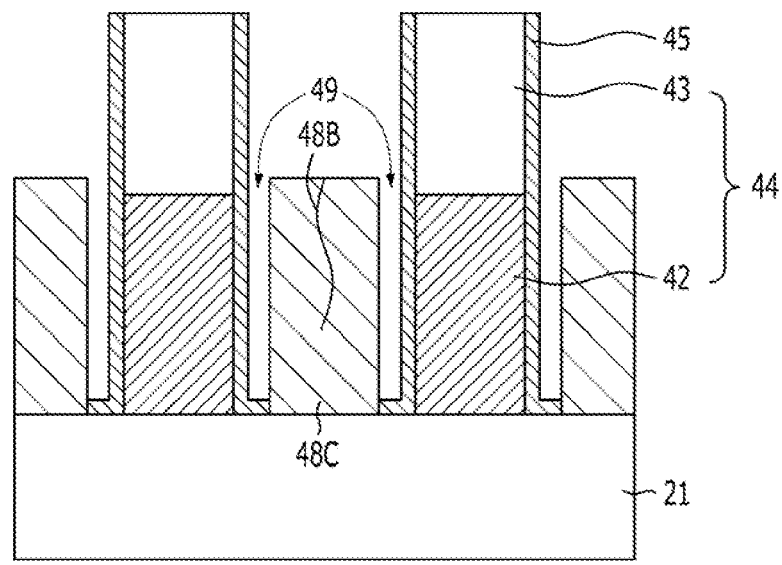

Referring to FIG. 4F, the sacrificial spacer 46 is selectively removed. Accordingly, an air gap 49 is formed. The air gap 49 may be formed on the sidewalls of the first contact plug 48C. The air gap 49 is formed between the first contact plug 48C and the bit line 42. Accordingly, an insulating structure of air gap 49-spacer 45 is formed between the bit line 42 and the first contact plug 48C.

In order to remove the sacrificial spacer 46, wet etch or dry etch may be applied. When the sacrificial spacer 46 is removed, the spacer 45, the first contact plug 48C, and the hard mask pattern 43 are not removed, because they have a lower etch selectivity than the etch selectivity of the sacrificial spacer 46. If the sacrificial spacer 46 is titanium nitride, then a wet cleaning process may be performed using a solution of $H_2SO_4$ and $H_2O_2$.

As the air gap 49 is formed, parasitic capacitance between the bit line 42 and the first contact plug 48C decreases.

Figure 4G:
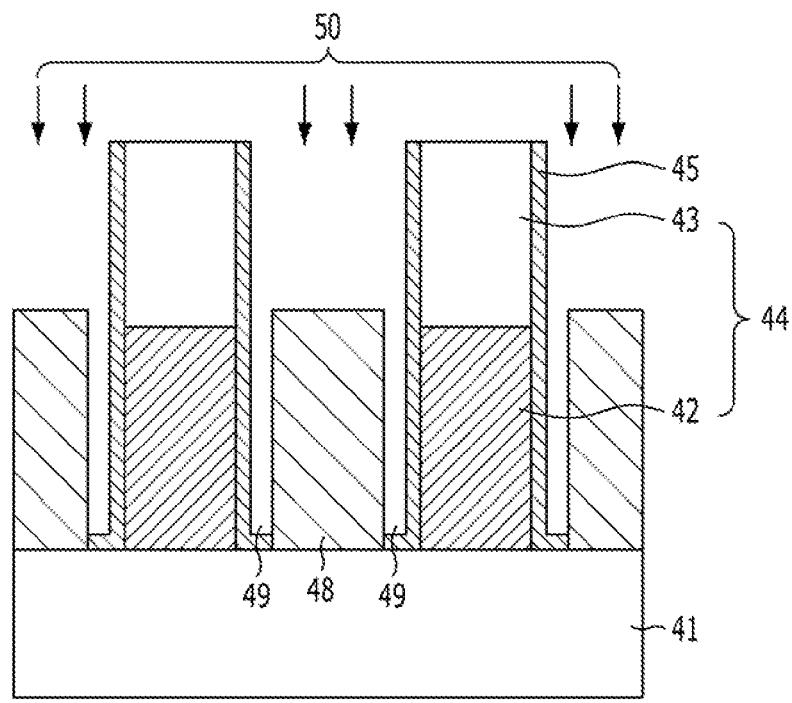

Referring to FIG. 4G, a thermal process 50 is performed. Accordingly, a seam 48B existing in the first contact plug 48C is removed. More specifically, the seam 48B escapes toward the air gap 49, and is then removed. The thermal process 50 may be performed at a temperature of at least 500° C. or more. The thermal process 50 may include a heat treatment using a furnace.

As described above, since the thermal process 50 is performed in a state where the air gap 49 is formed, the seam 48B is removed. Since the air gap 49 is formed on the sidewalls of the first contact plug 48C and the top surface of the first contact plug 48C is exposed to the air, the removal of the seam 48B is increased. That is, as the seam 48B is diffused toward the air gap 49 and simultaneously diffused to the outside of the top surface of the contact plug 48C, the seam 48B is removed.

In an exemplary embodiment, since the outer surface of the first contact plug 48C is contacted with the air gap 49 and the air, the seam 48B existing in the first contact plug 48C does not develop into a void, but is removed. Accordingly, a void-free first contact plug 48 is formed.

Figure 4H:
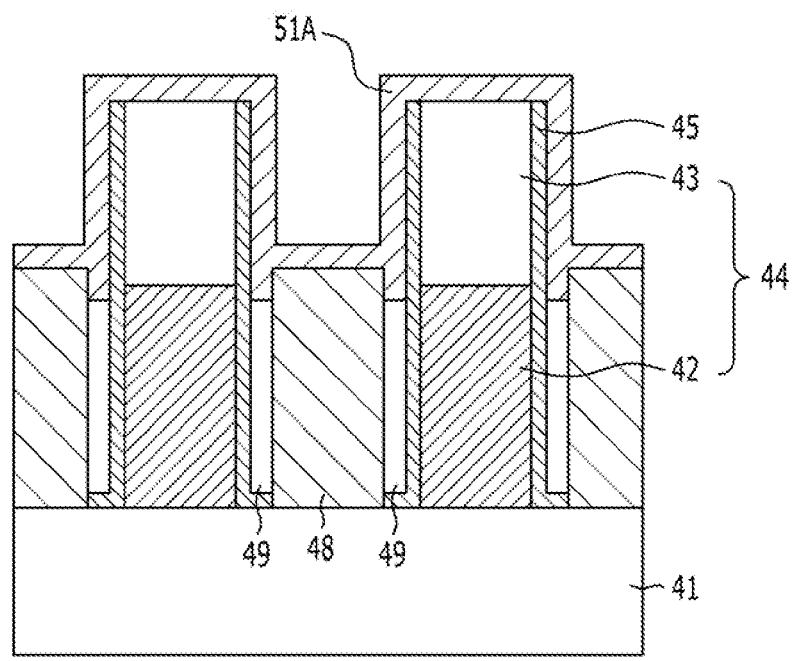

Referring to FIG. 4H, a capping layer 51A is formed over the first contact plug 48 to cap the air gap 49. The capping layer 51A may include an insulating material. The capping layer 51A may include silicon oxide or silicon nitride. The capping layer 51A may be formed to such a thickness as not to gap-fill the air gap 49.

Figure 4I:
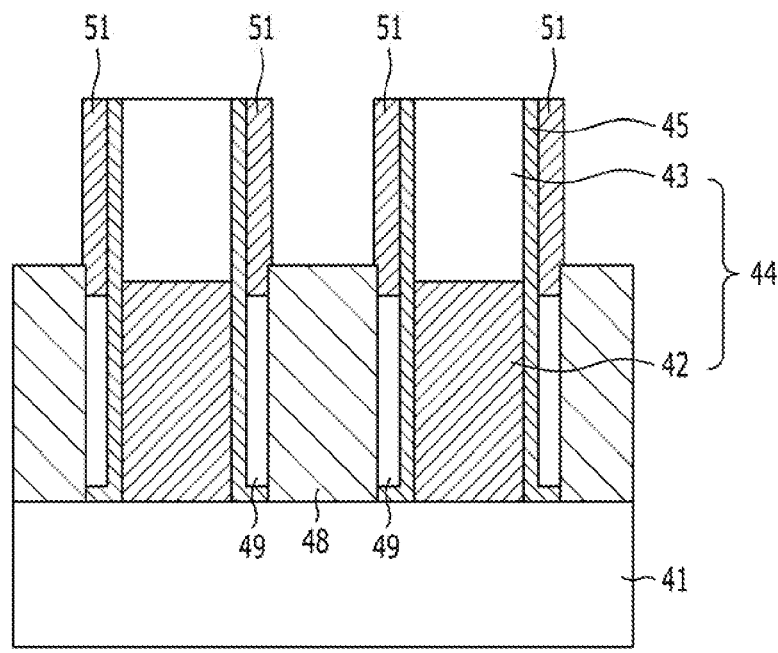

Referring to FIG. 4I, the capping layer 51A is selectively removed. Accordingly, a capping spacer 51 is formed. The capping spacer 51 caps the air gap 49 and simultaneously caps the upper sidewalls of the open portion over the first contact plug 48.

Although not illustrated, an ion implant process may be performed as a subsequent process after the capping spacer 51 is formed. The ion implant process is performed to improve contact resistance.

Figure 4J:
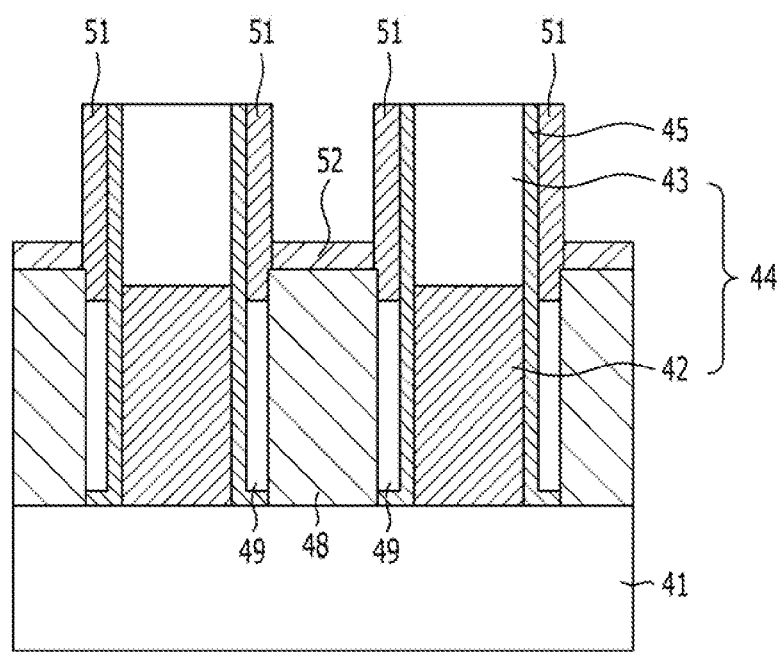

Referring to FIG. 4J, a metal silicide 52 is formed over the first contact plug 48. In order to form the metal silicide 52, a metal layer (not illustrated) may be formed on the entire surface of the resultant structure, and annealing may be then performed. The metal layer may include a metal that can be converted into silicide. The metal layer may include cobalt. Through the annealing, the metal layer and silicon of the first contact plug 48 may react with each other to form the metal silicide 52. The metal silicide 52 may include cobalt silicide. For example, the metal silicide 52 may include cobalt silicide with a $CoSi_2$ phase.

cobalt silicide having a lattice structure of $CoSi_2$, as the metal silicide 52, may improve contact resistance. Also, low-resistance cobalt silicide may be sufficiently formed in a small area of the storage node contact hole 47 having a fine critical dimension (CD). The metal silicide 52 may serve as an ohmic contact layer.

Figure 4K:
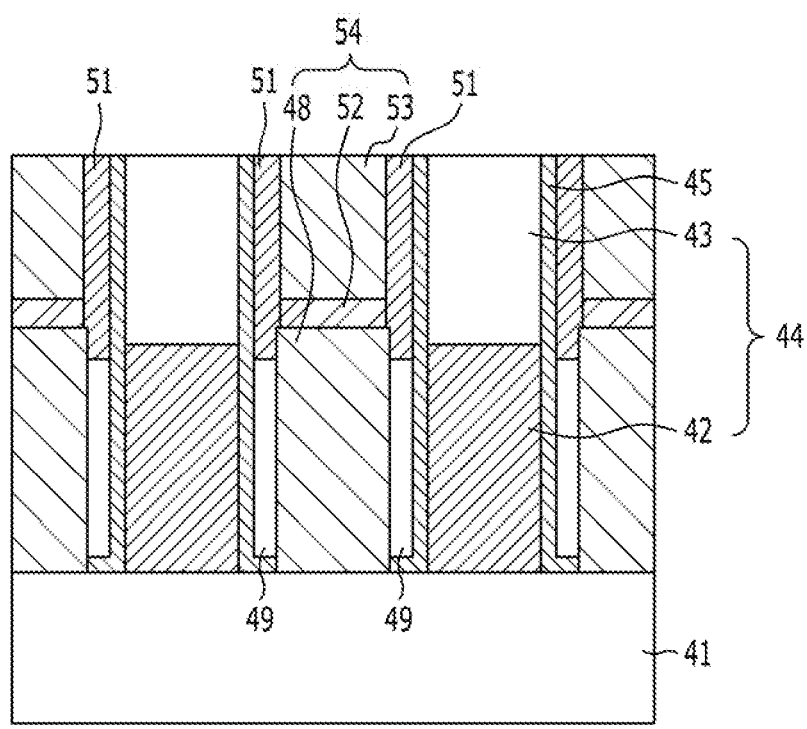

Referring to FIG. 4K, any unreacted metal layer is stripped. If the unreacted metal layer is not removed, then metal atoms of the unreacted metal layer may diffuse downward or may cause an abnormal reaction of the metal silicide 52 during a subsequent process. Therefore, the unreacted metal layer is removed. The unreacted metal layer may be removed through a cleaning process using a wet chemical. For example, when the unreacted metal layer is cobalt, chemicals based on $H_2SO_4$ (SPM) and $NH_4OH$ (SC-1) may be used. More specifically, de-ionized (DI) water is used to oxidize the unreacted metal layer, the chemical based on $H_2SO_4$ (SPM) is used to primarily remove the unreacted metal layer, and the chemical based on $NH_4OH$ (SC-1) is used to secondarily remove metal polymer-based residue.

As such, the wet chemicals may be used to remove the metal polymer as well as the unreacted metal layer.

Then, a second contact plug 53 may be formed over the metal silicide 53. In order to form the second contact plug 53, a third conductive layer is formed to fill the space over the metal silicide 52, and a planarizing process is performed. The second contact plug 53 may include a metal containing layer. The second contact plug 53 may include tungsten. Although not illustrated, the second contact plug 53 may further include a barrier layer. Therefore, the second contact plug 53 may be formed by stacking a barrier layer and a metal containing layer. The barrier layer may include a titanium containing material. The barrier layer may include a single layer of titanium or a stacked layer of titanium and titanium nitride.

When the second contact plug 53 is formed, a storage node contact plug 54 including the first contact plug 48, the metal silicide 52, and the second contact plug 53 is formed.

The air gap 49 is formed between the bit line structure 44 and the storage node contact plug 54. The first contact plug 48 may become a bottom plug of the storage node contact plug 54, and the second contact plug 53 may become a top plug of the storage node contact plug 54. Since the first contact plug 48 includes a silicon containing layer and the second contact plug 53 includes a metal containing layer, a contact plug including a silicon containing layer and a metal containing layer, that is, a semi-metal contact plug structure may be formed. Alternatively, the storage node contact plug 54 may have a double plug structure using a polysilicon layer. At this time, the metal silicide may not be formed.

The air gap 49 may be formed between the bit line 42 and the first contact plug 48.

Figure 5A:
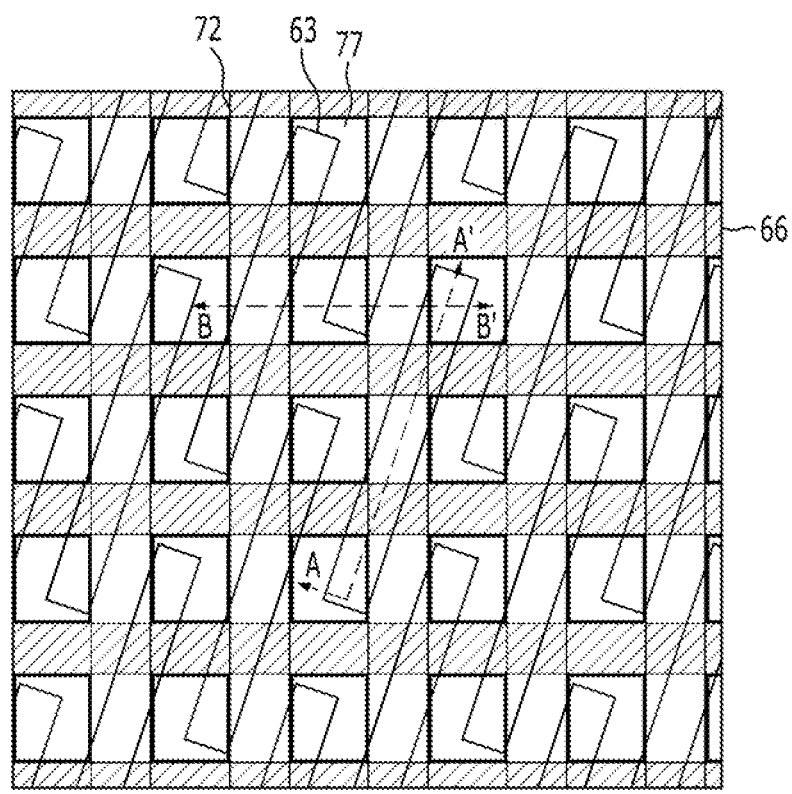
FIG. 5A is an arrangement diagram illustrating exemplary memory cells of a DRAM.
Figure 5B:
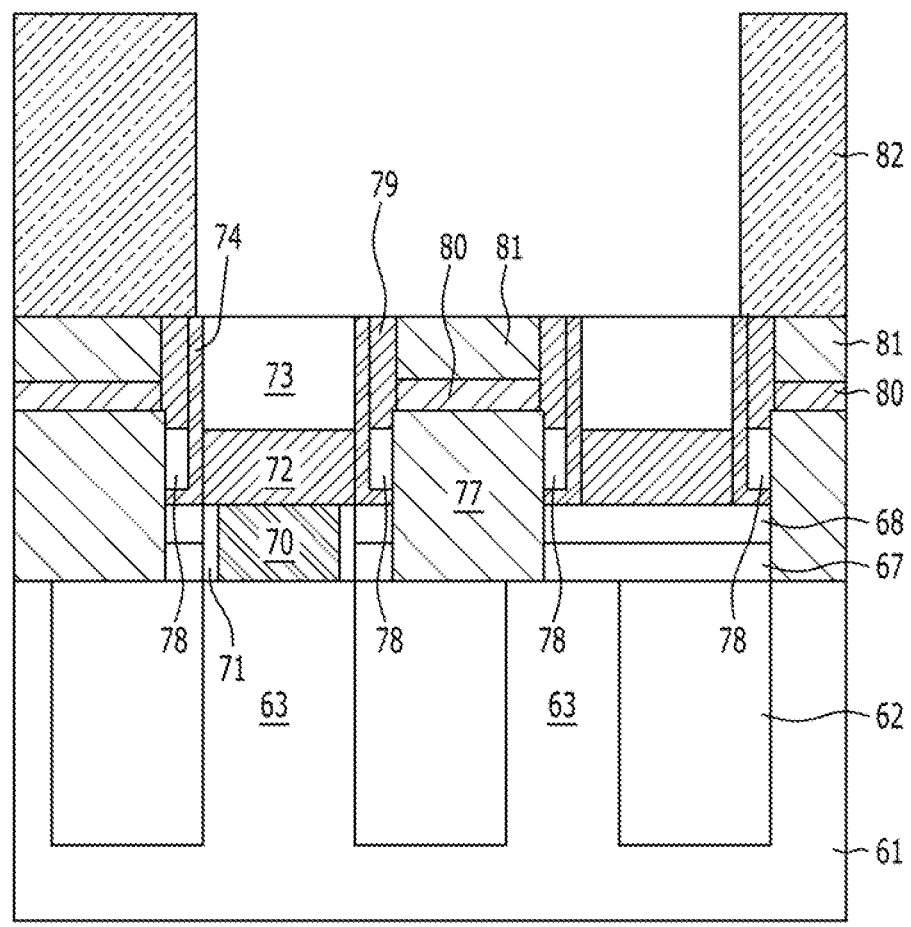
FIG. 5B is a cross-sectional view taken along line A-A' of FIG. 5A.
Figure 5C:
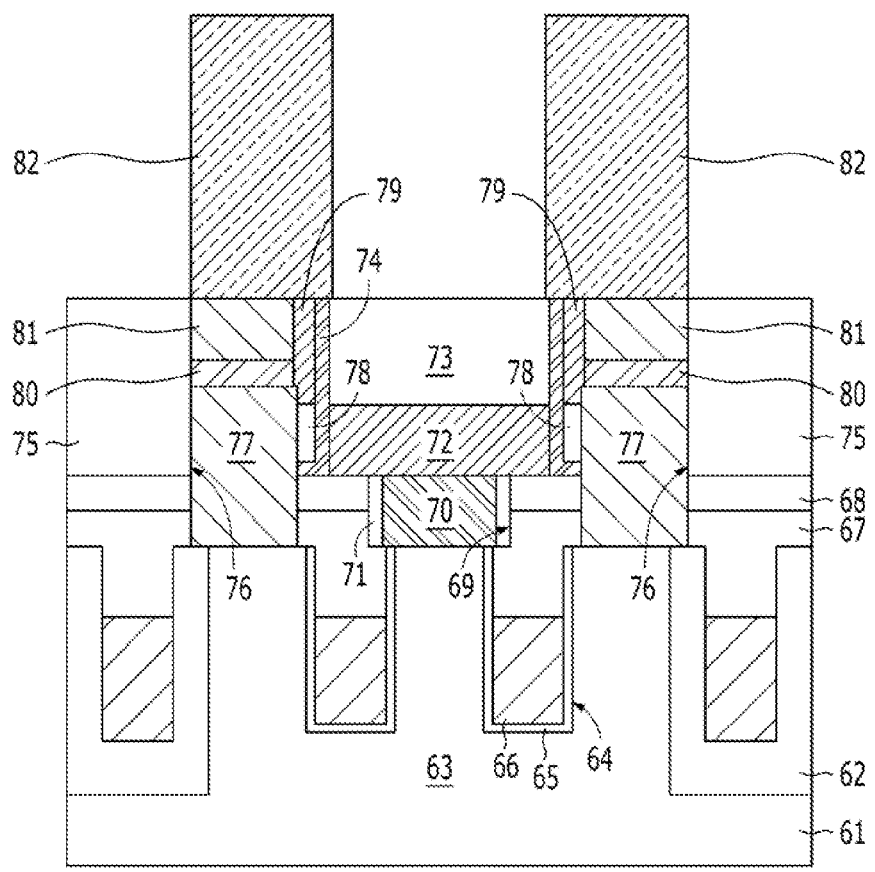
FIG. 5C is a cross-sectional view taken along line B-B' of FIG. 5A.

FIG. 5A is an arrangement diagram illustrating memory cells of DRAM. FIG. 5B is a cross-sectional view taken along line A-A of FIG. 5A. FIG. 5C is a cross-sectional view taken along line B-B' of FIG. 5A.

Referring to FIGS. 5A to 5C, an active region 63 is defined by an isolation region 62 in a substrate 61. A buried gate electrode 66 is formed in a trench 64 crossing the active region 63 and the isolation region 62. A bit line 72, extending in a direction crossing the buried gate electrode 66, is formed over the substrate 61, and the bit line 72 is connected to the active region 63 through a bit line contact plug 70. A storage node contact plug connected to the active region 63 is formed. The storage node contact plug may include a stack of a first contact plug 77, a metal silicide 80, and a second contact plug 81. A storage node 82 of a capacitor is formed over the second contact plug 81 of the storage node contact plug.

The storage node contact plug may correspond to the storage node contact plug in accordance with an exemplary embodiment, and the bit line 72 may correspond to a bit line of a bit line structure. Therefore, an air gap 78 may be formed between the storage node contact plug and the bit line 72. The storage node contact plug may include the first contact plug 77 and the second contact plug 81. A capping spacer 79 may cap the first contact plug 77 and the air gap 78. The capping spacer 79 may correspond to the capping spacer in accordance with an exemplary embodiment.

Referring to FIGS. 5A to 5C, an exemplary method for fabricating a memory cell will be described as follows.

The substrate 61 may include a semiconductor material. The substrate 61 may include a semiconductor substrate. The substrate 61 may include a silicon substrate. For example, the substrate 61 may include a single crystal silicon substrate. The isolation region 62 may be formed through a shallow trench isolation (STI) process. The active region 63 may be defined by the isolation region 62. The isolation region 62 may include a wall oxide, a liner, and a fill material, which are sequentially formed. The liner may include silicon nitride and silicon oxide. The silicon nitride may include $Si_3N_4$, and the silicon oxide may include $SiO_2$. The fill material may include silicon oxide, such as spin-on dielectric (SOD). Furthermore, the fill material may include silicon nitride. The silicon nitride used as the liner may be used as the fill material.

The trench 64 may be formed in both of the active region 63 and the isolation region 62. The trench 64 of the isolation region 62 may be formed to a larger depth than the trench 64 of the active region 63, due to a difference in etch rate between the active region 63 and the isolation region 62.

Before the buried gate electrode 66 is formed, a gate dielectric layer 65 may be formed on the sidewalls defining the trench 64. The buried gate electrode 66 may be formed by forming a metal containing layer to fill the trench 64 and then etching back the metal containing layer. The metal containing layer may include a material with a metal base such as titanium, tantalum, or tungsten. The metal containing layer may include TaN, TiN, WN, or W. For example, the buried gate electrode 57 may have a single layer structure of TiN, TaN, or W or a two-layer structure of TiN/W or TaN/W formed by stacking W over TiN or TaN. Furthermore, the buried gate electrode 57 may have a two-layer structure of WN/W formed by stacking W over WN. In addition, the buried gate electrode 57 may include a low-resistance metal material.

A sealing layer 67 is formed over the buried gate electrode 66. The sealing layer 67 may gap-fill the trench 64 over the buried gate electrode 66. The sealing layer 67 may serve to protect the buried gate electrode 66 during a subsequent process. The sealing layer 67 may include an insulating material. The sealing layer 67 may include silicon nitride.

A first interlayer dielectric layer 68 is formed, and the first interlayer dielectric layer 68 and the sealing layer 67 are etched to form a bit line contact hole 69. A bit line contact plug 70 is formed by burying polysilicon in the bit line contact hole 69. A bit line structure, including a bit line 72 and a bit line hard mask layer 73, is formed over the bit line contact plug 70. The bit line contact plug 70 may include void-free polysilicon, and a method for forming void-free polysilicon may be performed by referring to an above-described exemplary embodiment. A capping layer 71 may be formed on the sidewalls of the bit line contact plug 70. The bit line 72 may include tungsten. Alternatively, the bit line 72 may include a barrier layer of Ti/TiN and tungsten over the barrier layer. The bit line hard mask layer 73 may include silicon nitride.

A spacer 74 is formed on both sidewalls of the bit line structure. Then, a second interlayer dielectric layer 75 is formed, and the second interlayer dielectric layer 75, the first interlayer dielectric layer 68, and the sealing layer 67 are etched to form a storage node contact hole 76. A polysilicon layer is formed and recessed to form a first contact plug 77 in the storage node contact hole 76, and the sacrificial spacer is removed to form an air gap 78.

Then, a thermal process is performed to remove a seam of the first contact plug 77, thereby forming a void-free first contact plug 77.

A capping spacer 79 is used to cap the air gap 78.

A metal silicide 80 and a second contact plug 81 are formed over the first contact plug 77. The second contact plug 81 may include a metal containing layer. The second contact plug 81 may include a tungsten layer. Although not illustrated, the second contact plug 81 may further include a barrier layer. Therefore, the second contact plug 81 may be formed by stacking a barrier layer and a metal containing layer. The barrier layer may include a titanium containing material. The barrier layer may include a single layer of titanium or a stacked layer of titanium and titanium nitride.

A storage node 82 of a capacitor is formed over the second contact plug 81. The storage node 82 may have a cylinder shape. Alternatively, the storage node 82 may have a pillar shape. Although not illustrated, a dielectric layer and a plate node may be further formed over the storage node 82.

The above-described exemplary contact structure may be applied to DRAM (Dynamic Random Access Memory). Without being limited thereto, however, the contact structure may be applied to SRAM (Static Random. Access Memory), flash memory, FeRAM (Ferroelectric Random Access Memory), MRAM (Magnetic Random Access Memory), PRAM (Phase Change Random Access Memory) or the like.

Figure 6:
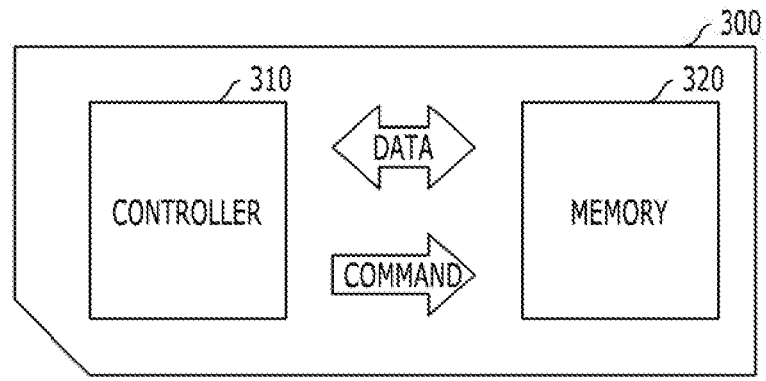
FIG. 6 is a schematic view of an exemplary memory card.

FIG. 6 is a schematic view of a memory card. Referring to FIG. 6, the memory card 300 may include a controller 310 and a memory 320. The controller 310 and the memory 320 may exchange electrical signals. For example, the memory 320 and the controller 310 may exchange data according to a command of the controller 310. Accordingly, the memory card 300 may store data in the memory 320, or output data to the outside from the memory 320. The memory 320 may include the above-described contact structure in a specific part thereof. The memory card 300 may be used as data storage media of various portable devices. For example, the memory card 300 may include a memory stick card, a smart media card (SM), a secure digital card (SD), a mini secure digital card (mini SD), or a multi-media card (MMC).

Figure 7:
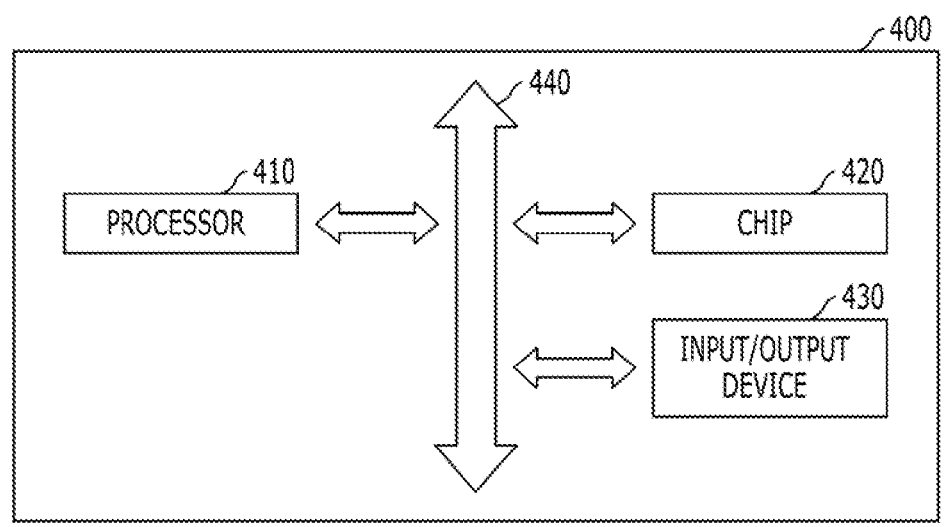
FIG. 7 is a block diagram illustrating an exemplary electronic system.

FIG. 7 is a block diagram illustrating an electronic system. Referring to FIG. 7, the electronic system 400 may include a processor 410, an input/output device 430, and a chip 420, which perform data communication through a bus 440. The processor 410 serves to perform a program operation and control the electronic system 400. The input/output device 430 may be used to input or output data of the electronic system 400. The electronic system 400 may be connected to an external device, for example, a personal computer or network, and exchange data with the external device through the input/output device 430. The chip 420 may store codes and data for the operation of the processor 410, and may process a part of operations applied to the processor 410. For example, the chip 420 may include the above-described CMOS device. The electronic system 400 may form various electronic control devices requiring the chip 420. For example, the electronic system 400 may be applied to a mobile phone, an MP3 player, a navigation system, a solid state disk (SSD), or household appliances.

In accordance an exemplary embodiment, the thermal process is performed after the recessed polysilicon layer pattern is formed in the contact hole and the air gap is formed. Therefore, the void-free polysilicon layer pattern may be formed.

Although exemplary embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, the method comprising:
   forming a buried gate electrode in a semiconductor substrate;
   forming an insulating layer over the buried gate electrode;
   etching the insulating layer to form a contact hole exposing the semiconductor substrate;
   forming a sacrificial layer on sidewalls of the insulating layer defining the contact hole;
   forming a polysilicon layer pattern in the contact hole;
   removing the sacrificial spacer; and
   performing a thermal process to remove a seam in the polysilicon layer pattern,
   wherein the thermal process is performed at a temperature range from 500° C. to 800° C. with a furnace annealing.

2. The method of claim 1 further comprising:
   forming a capping layer to fill the exposed sidewalls of the polysilicon layer pattern, after the performing of the thermal process.

3. The method of claim 1, wherein the thermal process comprises a furnace annealing or a rapid thermal annealing.

4. The method of claim 1, wherein the sacrificial layer comprises titanium nitride, silicon oxide, or boron nitride.

5. The method of claim 1, wherein the polysilicon layer pattern comprises a bit line contact plug or storage node contact plug.

6. A method for fabricating a semiconductor device, comprising:
   forming a plurality of bit line structures over a semiconductor substrate;
   forming a storage node contact hole between the plurality of bit line structures;
   forming a sacrificial spacer on sidewalls of the bit, line structures defining the storage node contact hole;
   forming a first contact plug in, the storage node contact hole;
   removing the sacrificial spacer;
   performing a thermal process to remove a seam in the first contact plug;
   forming a capping spacer to cap the exposed sidewalls of the first contact plug; and
   forming a second contact plug over the first contact plug.

7. The method of claim 6, wherein the forming of the sacrificial spacer comprises:
   forming a sacrificial layer on an entire surface of the resultant structure including the storage node contact hole; and
   etching the sacrificial layer to form the sacrificial spacer.

8. The method of claim 6, wherein the forming of the first contact plug comprises:
   forming a polysilicon layer to fill the storage node contact hole, and
   etching back the polysilicon layer.

9. The method of claim 6, wherein the thermal process is performed at a temperature of at least about 500° C. or more.

10. The method of claim 6, wherein the thermal process comprises furnace anneal or rapid thermal anneal.

11. The method of claim 6, wherein the sacrificial spacer comprises titanium nitride, silicon oxide, or boron nitride.

12. The method of claim 6, wherein the second contact plug comprises a metal containing material.

13. The method of claim 6, wherein the forming of a capping spacer comprises:
   forming an insulating layer to cover the first contact plug and the exposed sidewalls of the first contact plug; and
   etching back the insulating layer to expose a surface of the first contact plug.

* * * * *